United States Patent [19]

Ito et al.

[11] 4,067,099
[45] Jan. 10, 1978

[54] METHOD OF FORMING PASSIVATION FILM

[75] Inventors: Satoru Ito, Hinodemachi; Masataka Ota, Itsukaichimachi; Katsuro Sugawara, Kodaira, all of Japan

[73] Assignee: Hitachi, Ltd., Japan

[21] Appl. No.: 719,239

[22] Filed: Aug. 31, 1976

[30] Foreign Application Priority Data

Sept. 5, 1975    Japan .............................. 50-106997

[51] Int. Cl.² ......................................... H01L 21/203
[52] U.S. Cl. ......................................... 29/571; 29/590; 156/643; 156/656; 156/657; 156/667; 156/668; 148/175; 148/187; 204/38 A; 204/192 R; 204/192 D

[58] Field of Search ..................... 157/3, 8, 11, 13, 17, 157/22; 204/192 R, 192 C, 192 D, 192 E, 192 EC, 164, 38 A; 29/590, 628; 427/39, 91; 156/656, 657, 667, 643, 668, 662; 148/187, 175

[56] References Cited

U.S. PATENT DOCUMENTS 3,423,303   1/1969   Davidse et al. .................. 204/192 R Primary Examiner—William A. Powell
Assistant Examiner—Jerome W. Massie
Attorney, Agent, or Firm—Craig & Antonelli

[57] ABSTRACT

A method of forming a passivation film, wherein after circuit elements have been formed in the semiconductor substrate, a thin conductive film is formed on the entire surface of the substrate and then an insulating film is formed through electric discharge on the surface of the thin conductive film while the thin conductive film is kept at a constant potential.

9 Claims, 4 Drawing Figures

METHOD OF FORMING PASSIVATION FILM

BACKGROUND OF THE INVENTION

1. Field of the Invention

This invention relates to a method of forming an insulation film, using electric discharge, e.g. method of forming a passivation film by using sputtering.

2. Description of the Prior Art

Recently, in the field of semiconductor processing techniques, a method has come to be greatly needed which is adapted for forming a high-quality passivation film at low temperatures below 400° C, for the surface stabilization of semiconductor elements fabricated of III-V group compound, for the insulative separation of metal wirings in the integrated circuit, and for the surface protection of semiconductor devices.

Among the methods for meeting such a requirement is a method of forming a passivation film by utilizing discharging phenomenon. According to this method, insulation films serving as various passivation films can be formed, with the temperature of the semiconductor substrate kept below 300° C. In addition, the thickness of the formed film can be arbitrarily increased, having no upper limit and the grain of the film is very close so that high reliability can be attained. Therefore, this method is especially used, in the application to semiconductor fabricating techniques, when the uppermost passivation film is formed. For example, there is a method of forming a passivation film, using sputtering. In case of forming a film of $SiO_2$ on a silicon substrate, there is used a fused quartz as a sputtering source. However, there is a drawback that the characteristics of the resultant elements are deteriorated due mainly to lattice defects caused in the vicinity of the Si-$SiO_2$ interface by the surface injury in the sputtering process, to contaimination by Na ions introduced in the sputtering process, and to surface injury caused by impacts by electrons and ions during radio frequency sputtering. Accordingly, in case of bipolar IC's the $h_{FE}$ characteristics of the transistors are deteriorated while in case of MOS IC's the $V_{th}$ characteristics of the MOSFET's are lowered. It is thus not preferable to apply the method of forming a passivation film by sputtering, to semiconductor devices which requires high reliability, and especially to MOSIC's since in this case the ions accumulated in the gate electrode or in the gate insulation film often cause the $V_{th}$ characteristic of the MOSFET to be changed or deteriorated.

SUMMARY OF THE INVENTION

The object of this invention is to provide a method of forming a passivation film by utilizing electric discharge which method is free from the causes of characteristic deteriorations.

The method according to this invention is characterized by covering the main surface of a semiconductor substrate with a thin conductive film and then by forming on the thin conductive film an insulating passivation film through discharging phenomenon such as a sputtering, glow discharge and the like while the thin conductive film is kept at a fixed potential.

DESCRIPTION OF THE PREFERRED EMBODIMENT

Figure 1:
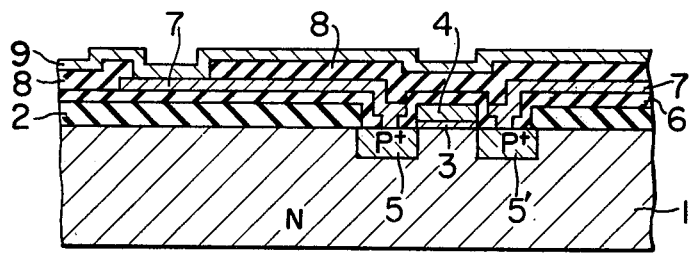
FIGS. 1 to 4 show in cross section the different steps of the method of fabricating a semiconductor device, using an embodiment of this invention.

The method of forming a passivation film through sputtering, according to this invention, will be described as applied to a MOSIC. As shown in FIG. 1, a MOSIC is fabricated through well-known techniques, with an N-type Si substrate (wafer) 1 used as a starting meterial. Namely, an oxide film 2 of $SiO_2$ is thermally formed on the surface of the N-type Si substrate 1 and the thermally formed oxide film 2 is selectively removed to make a part of the N-type substrate exposed. Then a gate oxide film ($SiO_2$) 3 is formed on the exposed surface, and further, a polycrystalline Si layer 4 is formed on the gate oxide film 3. Predetermined portions of the gate oxide film 3 are removed by photoetching technique according to the self-alignment process using as a mask that part of the polycrystalline Si layer 4, thereby two windows are formed through which source and drain regions are formed, and then, a P type impurity, for example, boron impurity is diffused through the windows into the N-type substrate 1, and $P^+$-type layers serving as a source 5 and a drain 5' are formed. During the diffusing process, the P type impurity is diffused into the polycrystalline 4, thereby, the polycrystalline Si layer 4 serves as a gate electrode. A PSG (phospho-silicate glass) film 6 is formed through the CVD (chemical vapor deposition) method and after electrodes for respective elements and Al film 7 for wiring have been formed, a surface protection film 8 of CVD $SiO_2$ film, polyimide resin such as film, PIQ (polyimide-iso-indroquinazolinedione) resin film or CVD PSG film is formed on the electrodes and Al film 7 so as to insulate the electrodes of respective elements and the wiring paths from each other. The CVD PSG film 8 is selectively etched away to expose a part of the Al film 7 which is to serve as a bonding pad.

Now, as shown in FIG. 1, an aluminum film 9 as a thin conductive film characterizing this invention is formed through, for example, vapor-deposition on the surface of the CVD PSG film 8 inclusive of that part of the Al film 7 which serves as a bonding pad.

Figure 2:
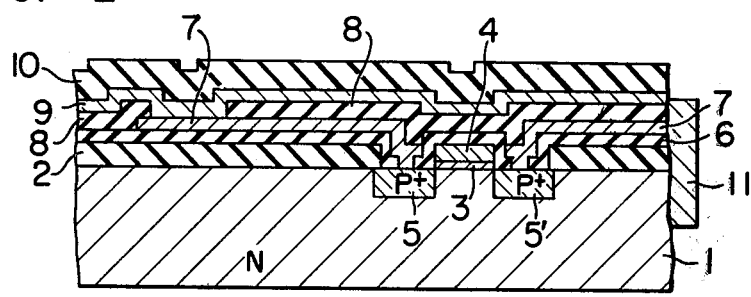

Next, as shown in FIG. 2, the thin conductive film 9 of Al is connected with the N-type substrate 1 by conductor 11, for example, Al film so that they are at the same potential. Then, a film 10 of $SiO_2$ is formed through sputtering on the Al thin film 9, which is used as the uppermost passivation film.

Figure 3:
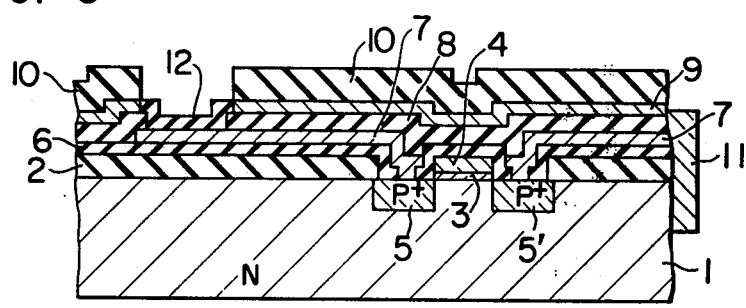

As shown in FIG. 3, that part of the $SiO_2$ film 10 which lies on the bonding pad is removed by photoetching and the thus exposed part of the Al thin film 9 is turned to an insulating film 12 of $Al_2O_3$ through, for example, anode oxidation process so that the part of the Al thin film 9 on the near the bonding pad is rendered non-conductive.

Figure 4:
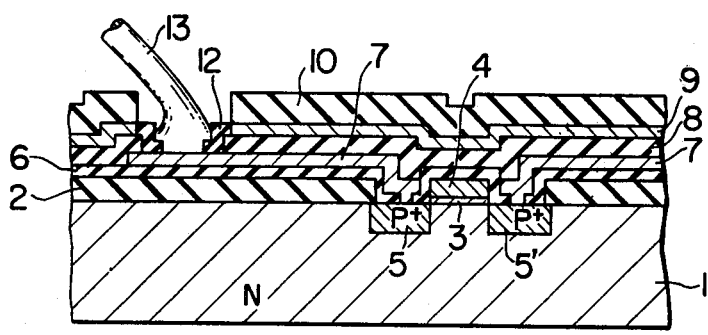

Finally, as shown in FIG. 4, that part of the $Al_2O_3$ film 12 which covers the bonding pad is removed by selective etching so as to make exposed the part of the Al film to serve as a bonding pad. The Si substrate 1, i.e., Si wafer, is divided into chips and then a bonding wire 13 of, for example, gold is attached to the bonding pad portion of the Al film 7 in the assembly process.

As described above, according to the method of forming a passivation film through sputtering, embodying this invention, the surface of the Si substrate 1 (Si wafer), in which circuit elements are formed, is entirely covered by a thin conductive film 9 of aluminum and a film 10 of $SiO_2$ serving as a passivation film is formed on the Al film 9 by sputtering while the Al film 9 is kept at the same potential as that of the Si substrate 1, that is, the substrate is being shielded. According to the method of forming the SiO₂ film 10 through sputtering, embodying this invention, therefore the defects caused in the interface between the N-type Si substrate 1 and the field oxide film 2 due to the surface injury during sputtering can be prevented by the provision of the thin conductive film, i.e., aluminum film 9, and moreover the contamination by, for example, the Na ions introduced into the SiO₂ film during sputtering can also be prevented by the thin conductive film 9. Further, since the thin conductive film 9 of aluminum electrically shields the Si substrate, the surface of the substrate 1 can be prevented from being injured by the impact of electrons and ions during RF sputtering or by the projection of light. Furthermore, no voltages are applied across the junctions in the Si substrate 1 including PN junctions during sputtering and no ions are accumulated in the vicinity of the junctions, so that the characteristics of the interface and PN junctions in the semiconductor device thus fabricated can be prevented from deteriorating. In the above described embodiment, the meritorious feature of forming a passivation film through sputtering, that a close-grain film can be formed to any desired thickness at lower temperatures, is put into practice. Also, the deteriorations of the MOS characteristic like $V_{th}$ or the PN junction characteristics like inverse voltage/current characteristics, can be prevented. Therefore, this invention can well be applied to the semiconductor devices such as MOS IC's.

Further, this invention can be applied to the process of fabricating semiconductor devices such as bipolar IC's and in that case there can be obtained a passivation film having desired characteristics such as a high reliability, a high surface stability and an excellent antimoisture property while preventing deteriorations of the $h_{FE}$ characteristic, the inverse blocking voltage characteristic, the inverse current characteristic and noise characteristic of the bipolar IC.

The thin conductive film according to this invention is not limited to aluminum one, but a non-doped noncrystalline Si film formed through vapor-deposition, a non-doped polycrystalline Si film, or a doped polycrystalline Si film may be adopted as such a thin conductive film. Especially, where a highly resistive semiconductor is used, it serves substantially as an insulator at room temperatures and it also serves as a thin conductive film to shield the Si substrate, during the process of forming the passivation film through sputtering, since the temperature of the Si substrate becomes 300° – 350° C during the sputtering process while electrons, ions and light impingement upon the surface of the highly resistive film. Accordingly, after the formation of the passivation film, the thin conductive film turns to an insulating one whereby no insulating separation near the bonding pad is needed. This can, therefore, be regarded as a typical example of a simple method of forming a thin conductive film.

The bonding wire 13 shown in FIG. 4 may be replaced by a wiring Al film. The insulating film serving as passivation film can also be formed by using electric discharge instead of sputtering. Among the methods using discharge there is known the glow discharge method which resembles the above described sputtering method in that a close-grain film can be obtained while surface injury may be caused during the discharging process. Therefore, this invention can be applied also to the glow discharge method.

Further, according to this invention, the thin conductive film need not be connected with the substrate but grounded to earth. Even in that case the same effect can be obtained as in the embodiment.

We claim:
1. A method of forming a passivation film for a semiconductor device comprising the steps, in combination, of
 a. depositing a conductive film over an entire surface of a semiconductor substrate provided with semiconductor elements therein;
 b. maintaining said conductive film covering said entire surface at a fixed potential; and
 c. forming a passivation film on said conductive film covering said entire surface by means of discharge technique while said conductive film is being maintained at said constant potential.
2. A method as claimed in claim 1, wherein said semiconductor substrate is of N-type silicon.
3. A method as claimed in claim 1, wherein said conductive film is of aluminum.
4. A method as claimed in claim 1, wherein said step (b) is carried out by connecting said conductive film covering said entire surface with said substrate utilizing a conductor so that said conductive film and said substrate may be kept at the same potential.
5. A method as claimed in claim 1, wherein said step (b) is carried out by grounding said conductive film.
6. A method as claimed in claim 1, wherein said passivation film is of SiO₂.
7. A method as claimed in claim 1, wherein said conductive film is made of a material selected from a non-doped noncrystalline Si vapor-deposited film, a non-doped polycrystalline Si film and a doped polycrystalline Si film.
8. A method as claimed in claim 1, wherein said step (c) is carried out by means of discharge technique selected from sputtering and glow-discharge techniques.
9. A method of fabricating a MOS IC, comprising the steps of
 a. forming a thermal oxide film (SiO₂) on the surface of an N-type Si substrate;
 b. selectively removing said thermal oxide film to expose a part of said N-type Si substrate;
 c. forming a gate oxide film (SiO₂) on the exposed surface of said substrate;
 d. forming a polycrystalline Si layer doped with impurity on said gate oxide film;
 e. etching away said polycrystalline Si layer and said gate oxide film, with that part of said polycrystalline Si layer which serves as a gate electrode being used as a mask;
 f. forming P+ layers for serving as a source and a drain by diffusing P-type impurity through the surface formed as a result of said etching;
 g. depositing PSG layer through CVD method on said thermal oxide film and said polycrystalline Si layer, except the portions where a source and a drain electrode are attached;
 h. forming a first Al film extending to said oxide film for provision of source and drain electrodes;
 i. covering said first Al film with a surface protection film selected from among a CVD SiO₂ film, a PIQ resin film and CVD PSG film;

j. selectively etching away said surface protection film so as to make exposed that part of said first Al film which serves as a bonding pad;
k. forming through vapor-deposition a second conductive Al film over the entire portion of said surface protection film and the entire part of said Al film which has been exposed by etching;
l. connecting said conductive Al film covering said entire portion of said surface protection film and said entire part of said first Al film with said substrate utilizing a conductor so as to maintain said second film and substrate at the same fixed potential;
m. forming on said second conductive Al film a $SiO_2$ film to be used as a passivation film through sputtering;
n. selectively removing that part of said $SiO_2$ film which lies on said bonding pad through photoetching;
o. rendering the part of said second conductive Al film adjacent said bonding pad to a non-conductive $Al_2O_3$ film through an anode oxidation method;
p. selectively removing the part of said $Al_2O_3$ film on said bonding pad so as to make said bonding pad exposed; and
q. attaching a gold bonding wire onto said bonding pad.

* * * * *